United States Patent [19]

Cardashian et al.

[11] Patent Number: 4,933,810
[45] Date of Patent: Jun. 12, 1990

[54] INTEGRATED CIRCUIT INTERCONNECTOR

[75] Inventors: Vahram S. Cardashian, Plymouth; Jerald M. Loy, Anoka; Frank S. Mills, Minneapolis, all of Minn.

[73] Assignee: Honeywell Inc., Minneapolis, Minn.

[21] Appl. No.: 44,861

[22] Filed: Apr. 30, 1987

[51] Int. Cl.$^5$ .............................................. H05K 1/04
[52] U.S. Cl. .................................................... 361/398
[58] Field of Search ...................... 174/52 F, 52 P, 52, 174/4; 361/398, 400, 410, 414

[56] References Cited

U.S. PATENT DOCUMENTS

| | | | |
|---|---|---|---|
| 3,683,105 | 8/1972 | Shamash et al. | 174/68.5 |
| 3,780,352 | 12/1973 | Redwanz | 361/398 X |
| 3,832,769 | 9/1974 | Olyphant et al. | 361/398 X |
| 3,967,162 | 6/1976 | Ceresa et al. | 361/398 |
| 4,064,552 | 12/1977 | Angelucci et al. | 361/414 |
| 4,249,302 | 2/1981 | Crepeau | 361/414 X |
| 4,251,852 | 2/1981 | Ecker | 361/399 X |
| 4,303,291 | 12/1981 | Dines | 174/68.5 X |
| 4,472,876 | 9/1984 | Nelson | 174/52 FP X |
| 4,480,288 | 10/1984 | Gazdik | 174/68.5 X |
| 4,587,596 | 5/1986 | Bunnell | 361/398 |
| 4,772,936 | 9/1988 | Reding et al. | 174/52.4 |

FOREIGN PATENT DOCUMENTS 0164921 12/1985 European Pat. Off. .
0178227 4/1986 European Pat. Off. .
2004127 3/1979 United Kingdom .

OTHER PUBLICATIONS

Motorola, Technical Description of Interconnection System for Motorola Main-Fram Semiconductor Memory, pp. 1 & 2, Nov. 1969, copy in 174/52 FP.
Auletta et al., Flexible Tape Conductor Interconnection for Chips, IBM Tech. Disc. Bull., v. 24, #2, Jul. 1981, pp. 1214 & 1215 relied on.

*Primary Examiner*—Gerald P. Tolin
*Attorney, Agent, or Firm*—W. T. Udseth

[57] ABSTRACT

A flexible film has electrical interconnections on each side. Through-film interconnects pass through openings in the film to connect the electrical interconnects on opposite sides of the film. Electrical contact patterns are formed on one side of the film to accomodate integrated circuit chips or other small electronic devices. Multichip circuits can be formed by connecting the chips to the pattern areas and connecting the patterns by way of the electrical interconnections on either side, or on both sides.

6 Claims, 2 Drawing Sheets

INTEGRATED CIRCUIT INTERCONNECTOR

This application is related to U.S. patent application Ser. No. 859,000, filed May 1, 1986 by V. S. Cardashian and J. M. Loy, and assigned to the same assignee as that of the present application.

BACKGROUND OF THE INVENTION

The present invention relates to the electrical interconnecting of monolithic integrated circuits in a preformed interconnection structure of only a small area.

Monolithic integrated circuits must be mounted in some mechanically secure manner during use, and must be electrically interconnected with other portions of the electronic system in which it is to operate. There is a desire to accomplish this in as little space as possible and at the lowest cost possible while assuring reliable interconnection during use in a chosen environment.

A typical approach is to mount such monolithic integrated circuit chips on a printed circuit board or on a ceramic substrate. Electrical interconnections to the chip electrical terminations are made from conductive tracks provided on the surface of such board or substrate. There are limits, however, to how closely monolithic integrated circuits can be arrayed on printed circuit boards due to limitations in printed circuit board track placement technology. Closer packing is possible on ceramic substrates, but they are relatively expensive.

The density of monolithic integrated circuits across such substrates can often be increased, and the cost of mounting and interconnecting such integrated circuits on substrates and boards can be reduced through the use of chip carrier films. Such films are of an electrical insulator material having conductive interconnections provided thereon. In each "frame" along the film, an individual monolithic integrated circuit is connected to the corresponding set of interconnectors therein which radiate into the chip.

Such a film can have many frames and thus many integrated circuits contained therein, one in each frame. The film with such integrated circuits can then be provided to a bonding machine which may automatically index a frame forward for each bonding, cut the tape interconnections near the edge of the film opening, and bond the remaining ends of the tape interconnections to a board or substrate to hereby interconnect the chip in the frame thereto.

Because the tape interconnections can be made quite small, some improvement in density can be achieved at least on ceramic substrates. The use of tape carrier feed in an automatic bonding machine can aid in the reduction of cost. However, greater integrated circuit packing densities are desired along with a further reduction in cost.

SUMMARY OF THE INVENTION

The present invention is a means for interconnecting a plurality of monolithic integrated circuits through use of a flexible insulating film with electrical interconnections on either side which are themselves interconnected at selected locations through the flexible film. Further, selected places on the film include a prearranged set of contacts, each such set to be connected to a corresponding monolithic integrated circuit. Thus multi-chip circuits can be formed on one surface of the flexible insulating film, with at least two of the chips connected by some of either or both of the electrical interconnections on either side of the film.

A passivation layer may be added over the chips and film. The film may be directly secured to a device, or mounted on a substrate or printed board.

DESCRIPTION OF THE PREFERRED EMBODIMENT

Figure 1:
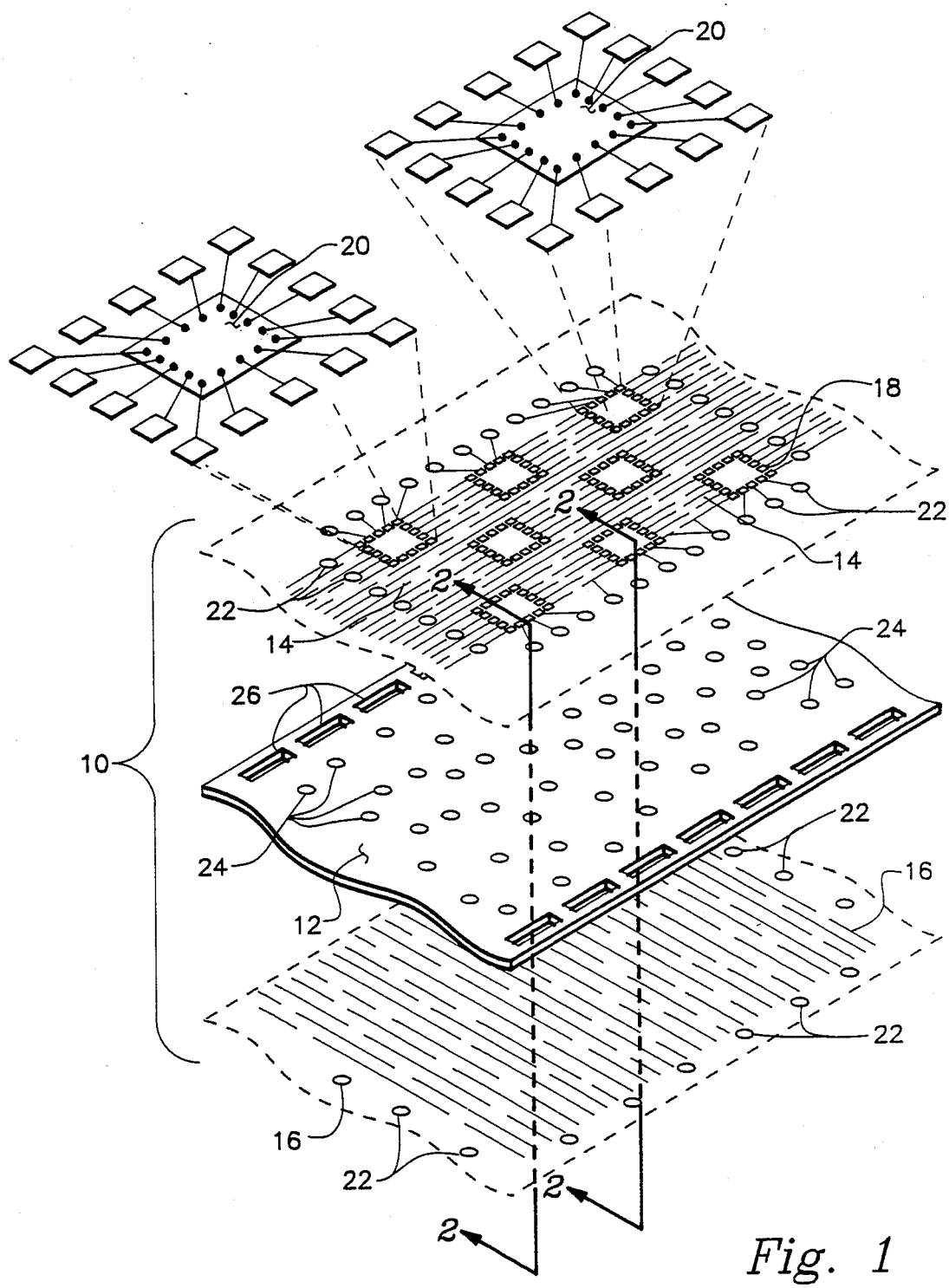
FIG. 1 is an exploded view of a portion of the present invention.

FIG. 1 is an exploded view of the three levels of the interconnection means 10 of the present invention. If the invention is to be provided as part of a tape, the portion shown in FIG. 1 would be one "frame" in a series of repeated frames.

The present invention includes a center or core 12, which is a flexible electrical insulating material such as a polyimide film. For a polyimide film, the film will typically be one to two mils in thickness. Core 12 will be designated below as a film unless indicated otherwise.

Adhering to the opposed major surfaces of film 12 are two sets, 14 and 16 respectively, of interconnection lines. These interconnections are shown with dashed lines around them to suggest that there is a layer devoted to each group, but the interconnections are independent from each other within each set unless actually physically connected to another inconnection line as part of a desired interconnection pattern.

The interconnections of set 14 are shown drawn all in one direction, as they are in group 16 but in an orthogonal direction to group 14. This is for illustrative purposes and is not the only geometrical pattern which could be used.

Set 14 shows an interconnection pattern in several places, 18, adapted for accepting interconnections of monolithic integrated circuits such as 20. Furthermore, set 14 also shows a series of interconnections terminals 22 along the sides of film 12 suitable for use in connecting to external circuits. Such external circuit interconnections 22 can also be made adjacent to set 16 interconnections.

Note that some of the interconnections in set 14 form direct contacts between different interconnection patterns 18. Thus, upon connection of monolithic integrated circuits 20 to interconnection patterns 18, some of the chips 20 may be directly connected (albeit typically through bonding wires, see FIG. 2) by the interconnections in set 14.

Multi-chip circuits can thus be provided within one frame of the tape, with various chips combining to provide an expanded function or with different functions being provided by various chips.

The resulting tape module is capable of being directly mounted in a device, or to a substrate or printed wiring board.

Typically, each of the interconnections in sets 14 and 16 are formed of copper over chromium with the chromium adhering to film 12. Each interconnection may, for example, be as fine as two mils wide with a spacing of again two mils from one another, edge to edge. Such fine interconnection lines and close spacing are provided using common metal deposition and photolithography techniques. For instance, the sputtering of chromium and some copper onto film 12 can be followed by electroplating the remaining copper to the desired thickness. Then, using photolithography methods common in integrated circuit fabrication, the patterns for each of the interconnections in sets 14 and 16 can be defined and formed. Selected registration markings may be provided in the same manner, such markings being used to determine relative positions on either side of film 12.

In addition, selected interconnections in set 14 are electrically interconnected to selected interconnections in set 16 through electrical conductors provided in openings 24 in film 12. Typically, copper is plated through these openings to provide through-film interconnections 24.

If desired, one can thus directly connect two interconnection patterns 18 (and thus connect the corresponding chips 20) by way of selected interconnections in set 14, selected openings 24 and selected interconnections in set 16. Further, the multi-chip circuits desired above with regard to interconnection set 14, can be provided by connections between chips being completed by utilizing interconnections 14, 16 (connected to patterns 18 through openings 24), or both interconnections 14 and 16 together (connected through openings 24).

The structure shown in FIG. 1 suggests that interconnection means 10 is in the form of a tape. Although a tape is a very convenient form of the present invention, the invention can also be provided in the form of a sheet having repeated patterns extending in more than one or two directions. For a tape, FIG. 1 shows sprocket holes 26 for sprockets to drive the tape in a machine adapted for use in combining the portion shown in FIG. 1 into the next higher assemblage in a manufacturing process.

Figure 2:
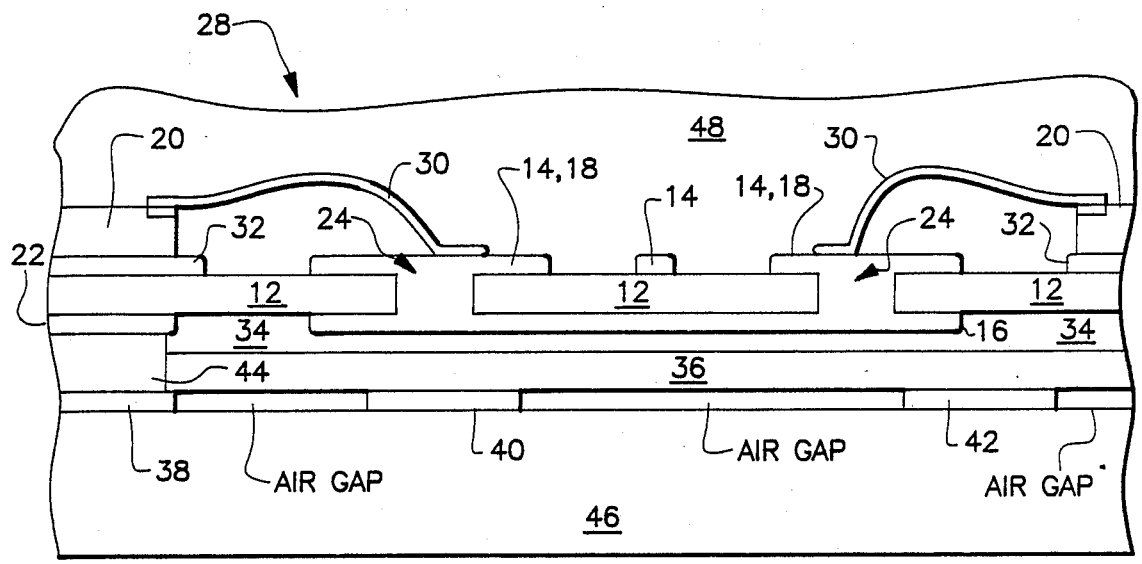
FIG. 2 is a partial sectional view along line 2—2 of FIG. 1, showing the present invention in its integrated form and, as an example, its further integration with integrated circuit chips and a substrate.

The partial sectional view of FIG. 2 depicts a typical assemblage 28 which includes interconnection means 10.

Assemblage 28 further includes two chips 20, each connected by, for example, wire bonds 30 to patterns 18, adhesives 32 and 34, and another insulating layer (e.g. polyimide) 36. Assembledge 28 also includes metal pads 38, 40 and, 42, and solder pad 44 which are all typically part of mother board 46. Of course mother board 46 could, in general, be a printed board or other support structure such as part of the casing of a device which will use chips 20.

Assemblage 28 is a useful structure for utilizing interconnections means 10. Chips 20 in addition to being electrically connected to patterns 18 by, for example, wire bonds 30, are typically affixed to one surface of film 12 by an adhesive 32. Adhesive 32 is typically an insulator (e.g. Pre-Preg A11-108 by Fortin) which prevents shorting of any conductive lines, including those of set 14, which may pass beneath the chip. However, if there are no metal lines beneath the chip site a carefully applied conductive adhesive could be used.

A second adhesive 34 is used to bond interconnection means 10 to an insulator/spacer (e.g. polyimide layer 36). Preferably, in assembly 28, the the input-output terminals 22 for interconnection means 10 are on the underside. Spacer 36 facilitates formation of solder pads 44 which join interconnection means 10 to mother board 46 (at pad 38). Pads 40 and 42 are unused in the particular assemblage shown. The same adhesive can be used for adhesive 32 and 34.

Alternatively, spacer 36 can be deleted and adhesive 34 used as the spacer too. In either case, if no connected conductive lines or pads on mother board 46 are under adhesive 34, and if no conductive lines in set 16 are in contact with adhesive 34, one could use a conductive adhesive. However, the Pre-Preg adhesive described above is particularly useful because it flows during heating at 15° C. to fill in spaces yet hardens well upon curing.

Following die attach and the wire bonding of chips 20 to patterns 18, an encapsulant 48 is typically used to cover the exposed upper surface of interconnection means 10, chips 20 and wire bonds 30. Encapsulant 48 can be an epoxy and it serves to protect assembly 28.

The invention has been described primarily in terms of multi-chip circuits. However, other electronic devices can be substituted for chips 20 with patterns 18 adjusted to accomodate the electrical contacts of such other electrical devices.

Figure 3:
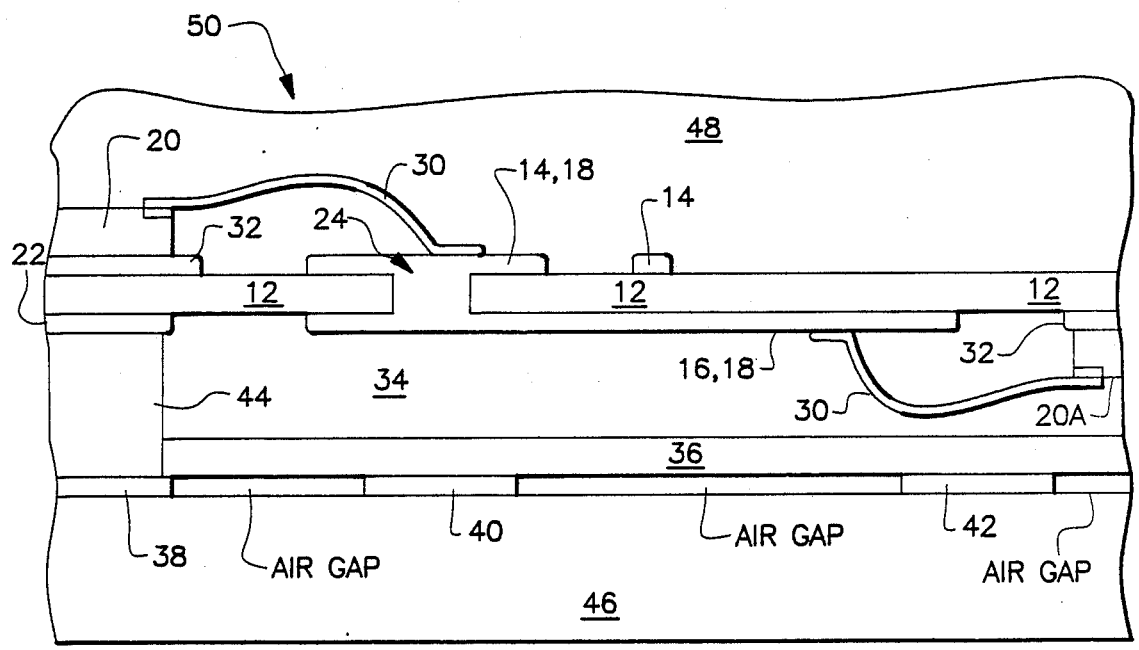
FIG. 3 is similar to FIG. 2, however, only one through-film is employed.

Further, it is possible to provide patterns 18 on either side of film 12 or on both sides of film 12 as shown in FIGS. 2 and 3. Consequently, chips 20 can be connected to patterns 18 on either side of film 12 or on both sides of film 12. The various connections between patterns 18 described above can, of course, be made to chips 20 on either or both sides of film 12.

What is claimed is:

1. A self-contained integrated circuit interconnect package for incorporation into an electrical or electromechanical device, wherein said device includes a printed circuit board with solder pads for connecting to said package, comprising:

- a flexible, thin electrical insulating film, having first and second openings therethrough, and having first and second oppositely disposed surfaces;
- a first set of electrical interconnection lines, located on said first surface and including first and second integrated circuit connection sites;
- first and second integrated circuits, wherein said first integrated circuit is wire bonded to said first integrated circuit connection site, and said second integrated circuit is wire bonded to said second integrated circuit site;
- a second set of electrical interconnection lines, located on said second surface;
- a set of interconnect terminal pads on said second surface, wherein some of said interconnect terminal pads are electrically connected to at least one of said first set of electrical interconnection lines or to at least one of said second set of electrical interconnection lines;
- first and second electrical connection through-films, located respectively in said first and second openings, wherein said through-films connect at least one of said first set of electrical interconnection lines which is connected to said first site to at least one of said first set of electrical interconnection lines which is connected to said second site, by way of at least one of said second set of electrical interconnection lines, to thereby provide an electrical signal path between said integrated circuit connection sites; and
- wherein some of said interconnect terminal pads are directly connected to said solder pads on said printed circuit board.

2. The package of claim 1 wherein there is no adhesive layer between said first set of electrical interconnection lines and said first surface, and there is no adhesive layer between said second set of electrical interconnection lines and said second surface.

3. The package of claim 1 further including:
a first insulative layer overlying said first surface except at selected locations thereon; and
a second insulative layer overlying said second surface except at selected locations thereon.

4. A self-contained integrated circuit interconnect package for incorporation into an electrical or electromechanical device, wherein said device includes a printed circuit board with solder pads for connecting to said package, comprising:
a flexible, thin electrical insulating film, having at least one opening therethrough, and having first and second oppositely disposed surfaces;
a first set of electrical interconnection lines located on said first surface and including a first integrated circuit connection sites;
a second set of electrical interconnection lines located on said second surface and including a second integrated circuit connection site;
first and second integrated circuits wherein said first integrated circuit is wire bonded to said first integrated circuit interconnection site, and said second integrated circuit is wire bonded to said second integrated circuit site;
a set of interconnect terminal pads on said second surface, wherein some of said interconnect terminal pads are electrically connected to at least one of said second set of electrical interconnection lines; and
at least one electrical connection through-film in said opening, said through-film connection at least one of said first set of electrical interconnection lines to at least one of said second set of electrical interconnection lines to provide an electrical signal path between said integrated circuit sites; and
wherein some of said interconnect terminal pads are directly connected to said solder pads on said printed circuit board.

5. The package of claim 4 wherein there is no adhesive layer between said first set of electrical interconnection lines and said first surface, and there is no adhesive layer between said second set of electrical interconnection lines and said second surface.

6. The package of claim 4 further including:
a first insulative layer overlying said first surface except at selected locations thereon; and
a second insulative layer overlying said second surface except at selected locations thereon.

* * * * *